US005950107A

United States Patent [19]

Huff et al.

[11] Patent Number: 5,950,107

[45] **Date of Patent: *Sep. 7, 1999**

[54] IN-SITU PRE-ILD DEPOSITION TREATMENT TO IMPROVE ILD TO METAL ADHESION

[75] Inventors: Brett E. Huff, Fremont; Farhad K. Moghadom, Los Gatos, both of Calif.

[73] Assignee: Intel Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/768,916

[22] Filed: Dec. 17, 1996

[51] Int. Cl.[6] .................................................... H01L 21/44

[52] U.S. Cl. .......................... 438/669; 438/677; 438/656; 438/685

[58] Field of Search .................................... 437/190, 192, 437/195; 438/625, 626, 631, 637, 238, 210, 702, 763, 786, 656, 669, 677, 685

[56] References Cited

U.S. PATENT DOCUMENTS

| | | | |
|---|---|---|---|
| 4,837,185 | 6/1989 | Yau et al. | 438/786 |
| 5,427,666 | 6/1995 | Mueller et al. | 204/192.17 |
| 5,563,105 | 10/1996 | Dobuzinsky et al. | 438/784 |
| 5,612,253 | 3/1997 | Farahani et al. | 437/190 |
| 5,700,711 | 12/1997 | Hsu et al. | 437/60 |
| 5,789,040 | 8/1998 | Martinu et al. | 427/575 |
| 5,856,238 | 1/1999 | Jung | 438/688 |
| 5,872,064 | 2/1999 | Huff et al. | 438/775 |
| 5,872,401 | 2/1999 | Huff et al. | 257/758 |

*Primary Examiner*—Charles Bowers
*Assistant Examiner*—Reneé R. Berry
*Attorney, Agent, or Firm*—Blakely, Sokoloff, Taylor & Zafman

[57] ABSTRACT

A method for improving interlayer dielectric to metal layer adhesion including an in-situ plasma treatment process. A metal layer which is formed on a substrate is treated with plasma prior to the deposition of the interlayer dielectric. The interlayer dielectric is deposited above the metal layer and contacts are formed through the interlayer dielectric which electrically connect the underlying metal layer to a subsequently formed metal layer. The plasma treatment step creates open molecular bonds on the surface of the metal layer which cause the interface between the metal layer and the interlayer dielectric to become more adhesive. Thus, decreasing the likelihood of delamination that degrades the electrical reliability of the device.

26 Claims, 6 Drawing Sheets

FIG. 2A
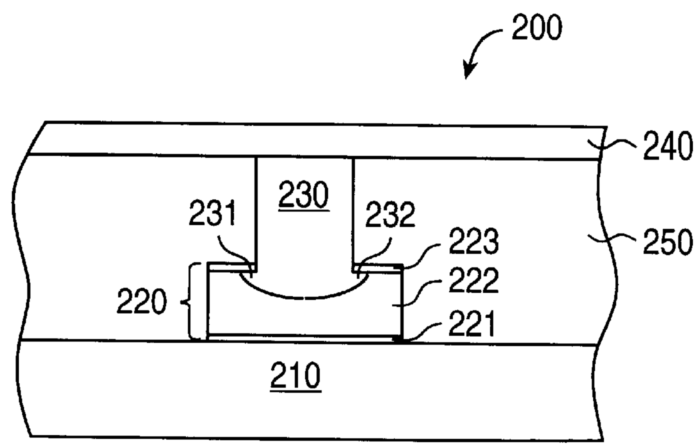
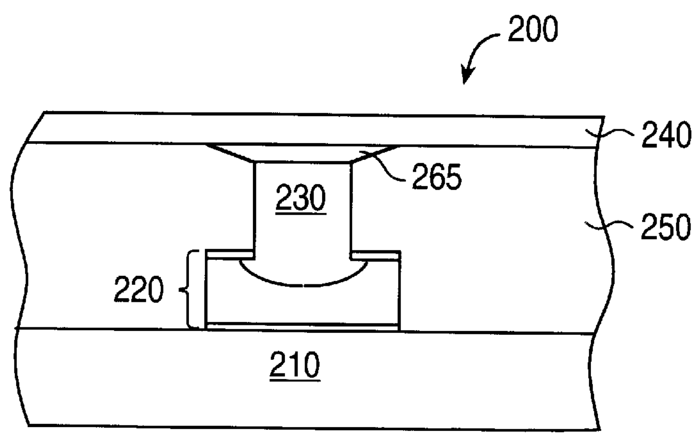
FIG. 2B
FIG. 3
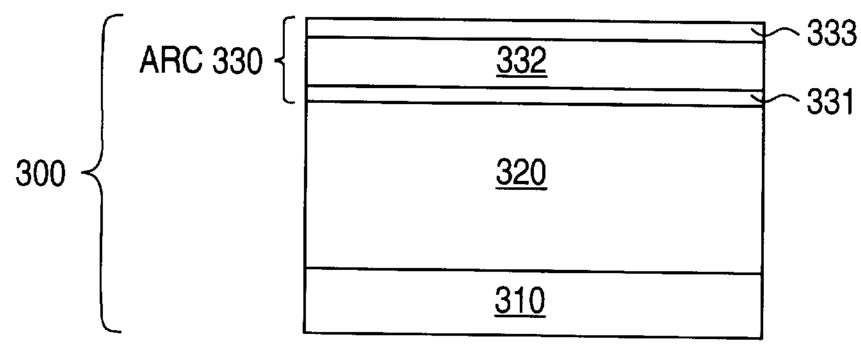

IN-SITU PRE-ILD DEPOSITION TREATMENT TO IMPROVE ILD TO METAL ADHESION

BACKGROUND OF THE INVENTION

1. Field of the Invention

This invention relates to the field of semiconductor devices, and more specifically, to a method for improving interlayer dielectric to metal adhesion.

2. Background Information

As semiconductor devices become more complex and the density of devices increases, the number of metal lines and/or metal layers used to interconnect such devices have also increased. In order to maintain and improve the electrical reliability of these devices the processes used to combine-dielectric and the metal layers must also improve. One problem that affects the electrical reliability of the metal layers is the adhesion between the interlayer dielectric and the metal layer. Poor interlayer dielectric to metal adhesion could lead to delamination. Delamination occurs when the interlayer dielectric and metal layer peel apart or separate. Delamination may cause problems when forming, filling, and electrically contacting a metal line. Thus, in the manufacture of semiconductor devices, it is important to have good interlayer dielectric to metal adhesion.

FIG. 1*a* illustrates a portion of a semiconductor device 100 having a metal stack 120 overlying a substrate 110 which is electrically connected to metal layer 140 via contact 130. Metal stack 120 is made up of a barrier layer 121, a metal layer 122, and an antireflective coating (arc layer) 123. Interlayer dielectric (ILD) 150 separates metal stack 120 from metal layer 140. Contact 130 is formed through ILD 150 to electrically connect metal stack 120 to metal layer 140. As shown in FIG. 1*a*, ILD 150 exhibits good adhesion to both metal stack 120 and to metal layer 140, thus the electrical reliability of the interconnection between stack 120 and metal layer 140 is very good.

Delamination of the ILD from the metal layer however, may occur for several reasons. One reason that delamination occurs may be the processing which the metal stack 120 is exposed to prior to the deposition of the ILD 150. For example, resist removal and wet etch techniques may leave potential contaminants and/or residues on the top surface and sidewalls of metal stack 120. Such contaminants and/or residues may degrade the adhesiveness between the metal stack and the ILD thus causing delamination to occur.

Another reason delamination occurs may be the difference in stresses of the two materials. Metal layers tend to be tensile films at room temperature. Tensile films push out on themselves, such that they tend to expand or take up the maximum molecular space. ILDs, which are generally oxides, tend to be compressive films. Compressive films pull inward on themselves, such that they tend to bind together or contract to take up the minimum molecular space. These stresses play on one another and affect the ILD to metal adhesion.

One way in which stresses may play a part in delamination has to do with the thicknesses of the metal layers and oxide layers. High density electronic circuits require multiple metal layers to complete the interconnects between transistors. Usually a metal layer required to carry a high current is thicker than a metal layer which is required to carry a lower current. In other words, the higher the current the thicker the metal layer. However, as the metal layers become thicker the ILD becomes comparatively thinner in order to maintain low contact resistance between subsequent metal layers. Thus, the stresses between a thick tensile metal film and a thin compressive ILD film provide an opportunity for delamination to occur.

Another way in which stresses may play a part in delamination is that subsequent processing steps performed after forming the metal layer and the ILD may include a heat cycle. During a heat cycle the entire wafer or a portion of the wafer may be heated. The rise in temperature may cause the metal layer to change from a tensile film into a compressive film. The ILD is already a compressive film, so as the metal film becomes compressive during heating the ILD layer and metal layer may pull (or peel) apart.

FIG. 1*b* illustrates one type of delamination that occurs during subsequent processing of the semiconductor device portion 100 illustrated in FIG. 1*a*. During a subsequent processing step, ILD 150 and metal stack 120 peel away from one another, thereby forming open 160. As shown in FIG. 1*b*, as ILD 150 and metal stack 120 peel away from one another, the contact 130 also lifts away from metal stack 120 thereby breaking the electrical connection between metal stack 120 and metal layer 140. Contact 130 may lift away from metal stack 120 due to a greater adhesion between contact 130 and ILD 150 than between contact 130 and metal stack 120. It should be noted that the contact 130 will stay with whichever metal layer has the most adhesion and will pull from the other.

FIG. 1*c* illustrates a similar delamination effect with the exception that ILD 150 has pulled away from metal layer 140 forming open 165. As ILD 150 and metal stack 120 peel away from one another, the contact 130 is also pulled away from metal layer 140 thereby breaking the electrical connection between the two metal layers. It should be noted that the delamination effect illustrated in FIG. 1*c* occurs mainly when the contact 130 and metal layer 140 are made from different materials or are made at separate times. One prior art technique which is used to solve the this type of delamination problem is to fill contact 130 at the same time that metal layer 140 is formed and with the same material. By filling the contact and forming the metal layer simultaneously, the contact 130 and metal layer 140 become one unit and will not pull away from one another. However, this does not solve the problem with respect to the delamination effect illustrated in FIG. 1*b*, wherein the delamination effect causes contact 130 to pull away from metal stack 120.

Another problem may occur with delamination before the formation of contact 130 and metal layer 140. As illustrated in FIG. 1*d*, delamination occurred when ILD 150 and metal stack 120 pulled away from one another forming opens 168 and 169, respectively. Thus when a via is etched in ILD 150 in order to form a contact 130 the vertical sidewalls of the via do not come directly in contact with metal stack 120. As shown in FIG. 1*d*, opens 168 and 169 are problematic when using a metal reflow technique to fill contact 130. Metal reflow techniques commonly use a wetting layer to aid the flow of the metal into the via. However, when wetting layer 170 is deposited, the vertical sidewalls and bottom surface of the via are coated, but because of opens 168 and 169 there is a break in wetting layer 170 between the sidewalls and the bottom such that wetting layer 170 is not continuous. Since wetting layer 170 is not continuous, when performing the metal reflow the metal flows into the via and stops at the break in wetting layer 170 causing a void to form at the bottom of contact 130. Void formation may degrade or even completely inhibit the electrical reliability of the contact.

It should also be noted that delamination may also occur where there are no contacts or plugs. In other words, delamination may occur wherever a metal layer contacts an ILD layer. Such delamination may lead to metal extrusions, shorts, and reliability failures when subjected to thermal heat cycling or are maintained at elevated operating temperatures for an extended time.

Another prior art method used to combat the problem of delamination in contact formation is the use of anchored vias, as is illustrated in FIG. 2*a*. FIG. 2*a* illustrates a portion of a semiconductor device 200 with an ILD 250 formed above a metal stack 220 and substrate 210. When forming a via the ILD is overetched in order to etch into the metal layer 222. After overetching, a clean is performed to remove the etchant, however, the via is overcleaned in order to remove a little more of metal layer 222 without removing any more of ARC layer 223, thereby forming rivets 231 and 232. The via is then filled to form anchored contact 230. Rivets 231 and 232, hold the anchored contact 230 and metal stack 220 together such that delamination may not pull anchored contact 230 from metal stack 220.

It should be noted and it will be obvious to one with ordinary skill in the art that anchored vias may generally only be used when the via is filled using chemical vapor deposition (CVD) techniques and not reflow metal techniques. CVD techniques, for example CVD tungsten techniques, allow rivets 231 and 232 to be filled because CVD techniques do not depend upon the continuity of a wetting layer to deposit the fill material into the bottom and rivets of the via. Reflow metal techniques, however, as described earlier with respect to FIG. 1*d*, require a continuous wetting layer in order to aid the flow of the metal into the bottom of the via. Thus, reflow metal techniques would not be able to fill rivets 231 and 232 and would leave a void in the bottom of anchored contact 230.

Another disadvantage to using anchored vias is that the etch and cleaning processes are very hard to control. In other words, it is hard to determine how long to leave the etchant and/or cleaning solution in the via in order to form the desired rivets. It is also hard to determine how quickly the etchant and/or cleaning solution should be removed. If the etchant and/or cleaning solution are not removed promptly or completely the etch process may continue to a point that may degrade device performance.

An additional disadvantage to the use of anchored vias is that the lower portion of contact 230 is anchored into metal stack 220, however the top portion of contact 230 is not anchored. Thus, as illustrated in FIG. 2*b*, if delamination occurs the contact 230 and metal layer 240 may still pull away from one another, forming an open 265.

Thus, what is needed is a method for improving ILD to metal layer adhesion in the formation of semiconductor devices.

SUMMARY OF THE INVENTION

The present invention describes a method for improving interlayer dielectric to metal layer adhesion. One embodiment of the present invention forms a metal layer on a substrate. The metal layer is treated with plasma prior to the deposition of the interlayer dielectric. Then the interlayer dielectric is deposited above the metal layer. The plasma treatment step creates open molecular bonds on the surface of the metal layer which cause the interface between the metal layer and the interlayer dielectric to become more adhesive.

Additional features and benefits of the present invention will become apparent from the detailed description, figures, and claims set forth below.

BRIEF DESCRIPTION OF THE DRAWINGS

The present invention is illustrated by way of example and not limitation in the accompanying figures in which:

FIG. 2*a* illustrates a cross-sectional view of a portion of a semiconductor device having an anchored via.

FIG. 2*b* illustrates a cross-sectional view of the portion of the semiconductor device of FIG. 2*a* wherein delamination has occurred.

FIG. 3 illustrates an enlarged cross-sectional view of one embodiment of a metal stack.

DETAILED DESCRIPTION

Figure 1A:
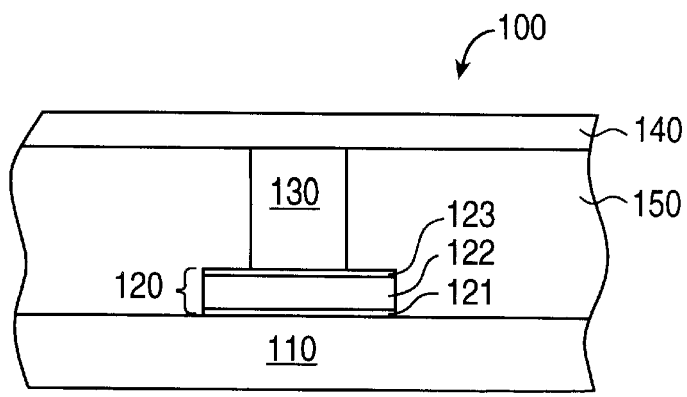
FIG. 1*a* illustrates a cross-sectional view of a portion of a semiconductor device having interconnected metal layers.
Figure 1B:
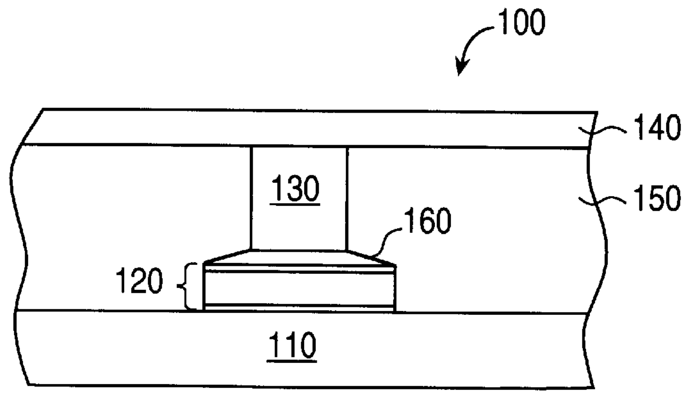
FIG. 1*b* illustrates a cross-sectional view of the portion of the semiconductor device in FIG. 1*a* wherein one type of delamination has occurred.
Figure 1C:
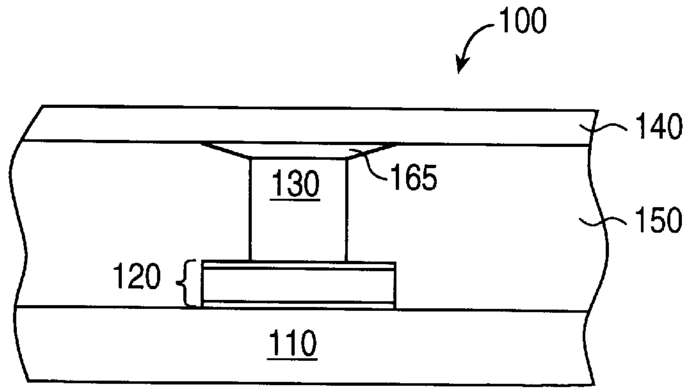
FIG. 1*c* illustrates a cross-sectional view of the portion of the semiconductor device in FIG. 1*a* wherein another type of delamination has occurred.
Figure 1D:
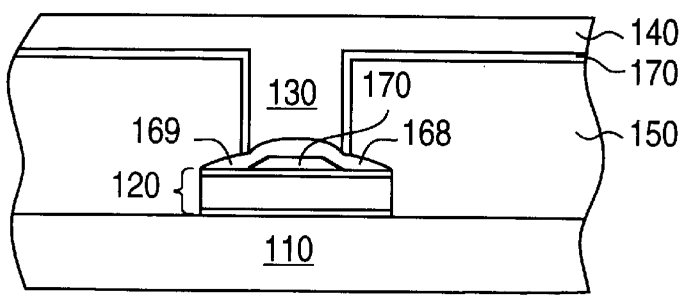
FIG. 1*d* illustrates a cross-sectional view of a portion of a semiconductor device wherein delamination has inhibited the reflow of metal into a via.

An In-Situ Pre-ILD Deposition Treatment to Improve ILD to Metal Adhesion is disclosed. In the following description, numerous specific details are set forth such as specific materials, reticle patterns, dimensions, etc. in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention.

The present invention describes a method for treating a metal layer in order to increase interlayer dielectric to metal adhesion and thereby decreasing delamination. The present invention includes a treatment step wherein a metal layer is treated with a plasma in order to improve the adhesiveness between the metal layer and an interlayer dielectric. As stated in the background of the invention, improved interlayer dielectric to metal layer adhesion improves the electrical reliability of the device being fabricated.

FIG. 3 illustrates one embodiment of a metal layer (or metal stack) 300 used in the present invention. Metal stack 300 is made up of three general layers: barrier layer 310, metal layer 320, and antireflective coating 330. Barrier layer 310 may be made of titanium and acts as an effective electrical shunt. It should be noted and it will be obvious to one with ordinary skill in the art that a barrier layer is not relevant to the surface treatment of the present invention and in no way prevents delamination. It should also be noted that if a barrier layer is used, it may be made up of other materials.

Metal layer 320 may be made of any type of conducting material, such as for example Aluminum, Aluminum Copper Alloy, Tungsten, etc. It should be noted and it will be obvious to one with ordinary skill in the art that other conductive materials, metals, alloys, etc. may be used. Antireflective coating 330 is used to improve the patterning of metal stack 300, such that reflection and/or scattering during lithographic patterning are minimized and the dimensions of the metal stack may be controlled. Antireflecting coating (arc layer) 330 may be a single or multiple layer structure. As shown in FIG. 3, arc layer 330 is a trilayer structure made up of a titanium nitride layer 331, titanium layer 332, and titanium nitride layer 333. It should be noted and it will be obvious to one with ordinary skill in the art that arc layer 330 may also be a single layer, for example a single layer of titanium nitride.

To improve the adhesion between the metal stack and the ILD, the present invention includes a pretreatment step, i.e. a treatment step performed on the metal stack prior to the deposition of the ILD. It should be noted that some manufacturers pattern the metal stack and then store the semiconductor wafer until a later time or day when processing of that wafer is resumed. In other words, after the metal stack has been patterned the semiconductor wafer may sit around or be transferred to another tool and it may be hours or even days before the ILD is deposited on the wafer. Thus, leaving the metal stack exposed to many different ambients and or potential contaminants that may degrade ILD to metal adhesion. In one embodiment of the present invention the pretreatment step is performed in-situ, i.e. in the process tool used to deposit the ILD, so that it is known what the metal surface has been exposed to rather than having the device sit around in storage before the ILD is deposited.

Figure 4A:
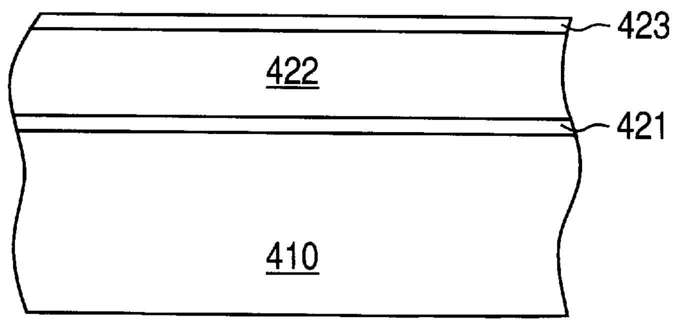
FIG. 4*a* illustrates a cross-sectional view of a portion of a semiconductor device having a substrate with a barrier layer, metal layer, and antireflective coating deposited thereon.

An example of the present invention is illustrated in FIGS. 4*a*–4*j*. FIG. 4*a* illustrates a cross-sectional view of a substrate 410 having a barrier layer 421, a metal layer 422, and an antireflective coating 423 deposited thereon. It should be noted and it will be obvious to one with ordinary skill in the art that substrate 410 may be any layer of a semiconductor device upon which it is desirable to form a metal layer. In other words, substrate 410 may be the first layer of a semiconductor device or any subsequent layer of the semiconductor device and what material the substrate 410 is made of depends upon the structure of the particular semiconductor device being fabricated. For example, depending upon what type of metal is used in the formation of the metal layer, substrate 410 may be a borophosphate silicate glass (BPSG) layer, an oxide layer, etc.

Barrier layer 421 may be made of any material that acts as an electrical shunt. Metal layer 422 may be any metal layer deposited using chemical vapor deposition, sputter deposition, or any other deposition techniques. For example, metal layer 422 may be made of aluminum, aluminum alloys, etc.

Antireflective coating (arc layer) 423, as stated above may be a single layer or a multiple layer structure. A single layer antireflective coating may be made of titanium nitride. A multiple layer antireflective coating may be made of a combination of titanium and titanium nitride layers. FIG. 3 illustrates a trilayer antireflective coating 330, that is used in one embodiment of the present invention.

Figure 4B:
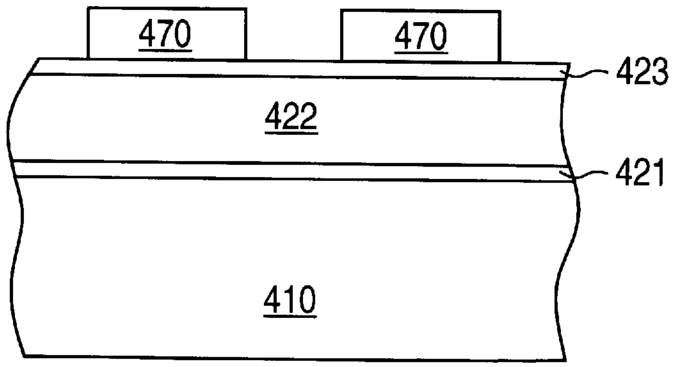
FIG. 4*b* illustrates a cross-sectional view of a portion of the semiconductor device of FIG. 4*a* having a patterned photoresist deposited thereon.
Figure 4C:
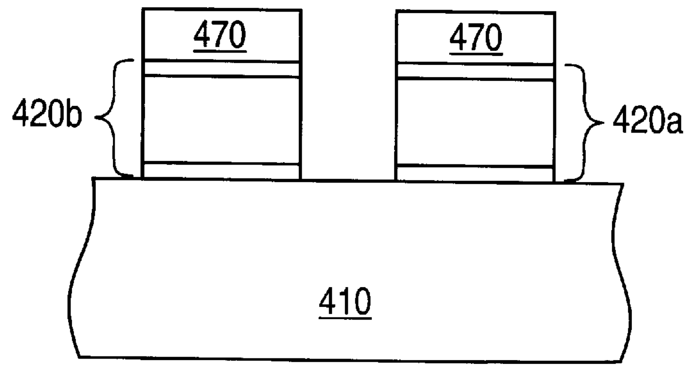
FIG. 4*c* illustrates a cross-sectional view of a portion of the semiconductor device of FIG. 4*b* after an etch step has formed metal stacks.
Figure 4D:
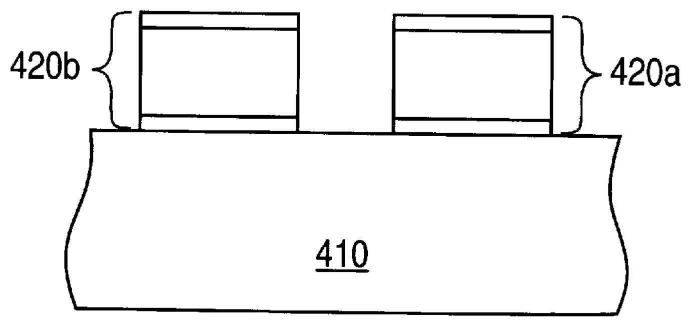
FIG. 4*d* illustrates a cross-sectional view of a portion of a semiconductor device having metal stacks formed thereon.

FIG. 4*b* illustrates the deposition and patterning of a photoresist 470. General photoresist deposition and patterning techniques are well known in the art and are therefore not discussed in detail herein. Photoresist 470 is used to pattern barrier layer 421, metal layer 422, and arc layer 423 into metal stacks 420*a* and 420*b*, as illustrated in FIG. 4*c*. It should be noted and it will be obvious to one with ordinary skill in the art, that the etch chemistries used to form metal stacks 420*a* and 420*b* will depend upon the type of materials used to form barrier layer 421, metal layer 422, and arc layer 423 and are generally well known in the art. Thus, the specific etch chemistries are not discussed herein. It should also be noted and it will be obvious to one with ordinary skill in the art, that a single metal stack or multiple metal stacks may be formed, and that the figures herein are merely meant to be illustrative and not limiting. FIG. 4*d* illustrates metal stacks 420*a* and 420*b* after photoresist 470 has been removed.

Figure 4E:
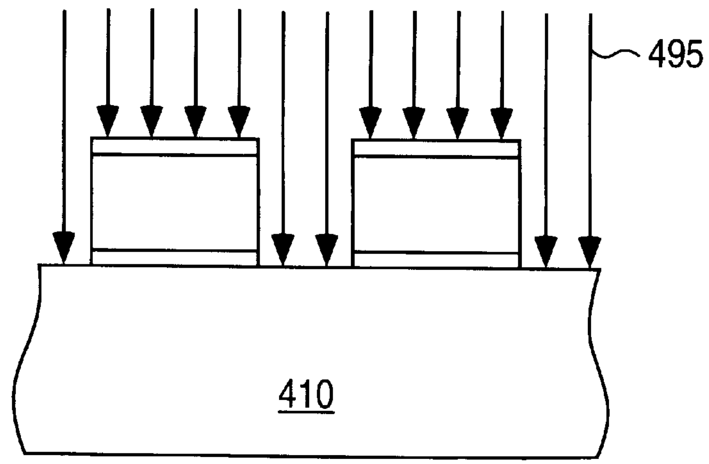
FIG. 4*e* illustrates a pretreatment step of the metal stacks of FIG. 4*d*.
Figure 5A:
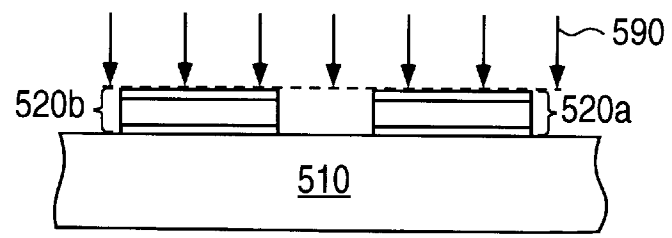
FIG. 5*a* illustrates a single frequency plasma treatment step of one embodiment of the present invention.
Figure 5B:
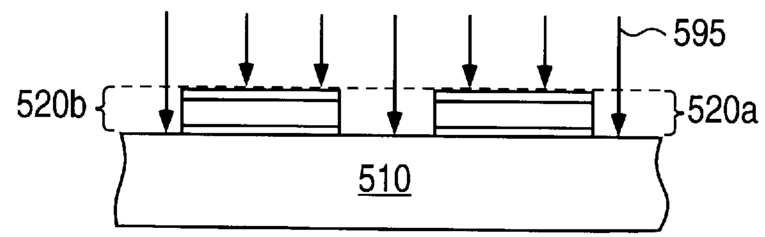
FIG. 5*b* illustrates a dual frequency plasma treatment step of another embodiment of the present invention.

After metal stacks 420*a* and 420*b* have been formed and prior to the deposition of an interlayer dielectric, the metal stacks 420*a* and 420*b* are subjected to a pretreatment step as is illustrated in FIG. 4*e*. The pretreatment step is performed by subjecting the metal stacks to a dual-frequency plasma. FIGS. 5*a* and 5*b* illustrate the differences between a single frequency plasma treatment and a dual-frequency plasma treatment.

As shown in FIG. 5*a*, when treating metal stacks 520*a* and 520*b* which are spaced relatively close to one another, the single frequency plasma 590 stops at the uppermost boundary of metal stacks 520*a* and 520*b* and does not treat the sidewalls and bottom surfaces between the metal stacks. However, when using a dual frequency plasma 595, as illustrated in FIG. 5*b*, the top surface, sidewalls, and bottom surfaces between the metal stacks are all treated. It should be noted and it will be obvious to one with ordinary skill in the art, that single frequency plasmas may still be used if the density of the metal stacks are low enough that the entire metal stack may be treated. In other words, if the metal stacks are positioned so far apart that the single frequency plasma can effectively treat the sidewalls and top surfaces of the metal stacks. As described earlier though, the current trend is toward higher densities in semiconductor devices, thus the need for dual frequency plasma treatment. Additionally it should be noted that single frequency plasmas may be used but require longer treatment times that can lead to charging damage. Thus dual frequency plasmas are more time efficient and effective.

The plasma treatment step may be performed using various types of plasmas, for example, oxygen, nitrogen, and helium plasmas may be used. The type of plasma used to improve adhesion between the metal and interlayer dielectric may depend on the strength and time required to improve adhesion. For example, exposing the metal stacks to a strong oxygen plasma for a shorter duration may improve the adhesion between the metal layer and the interlayerdielectric to the same extent that exposing the metal stacks to a similar strength helium plasma for a longer duration. In one embodiment an oxygen plasma of approximately 400 watts (400 kHz) for approximately 15–60 seconds may be used. Such a process may increase the sheet resistance to approximately 30–100 Ohms/square.

Figure 6A:
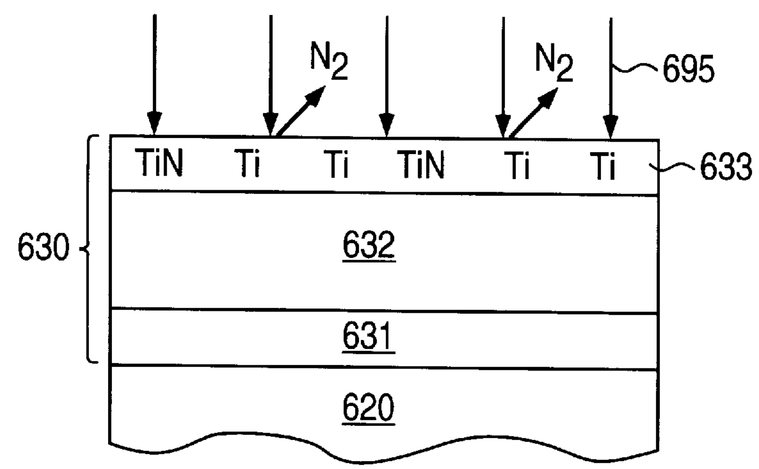
FIG. 6*a* illustrates the pretreatment of an antireflective coating of one embodiment of the present invention.
Figure 6B:
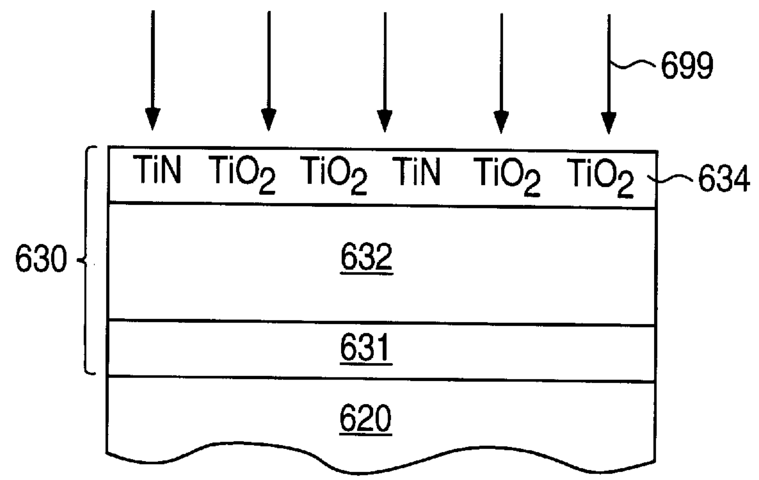
FIG. 6*b* illustrates the resultant surface characteristics of the antireflective coating after the pretreatment step illustrated in FIG. 6*a*.

The pretreatment step improves the adhesion between the metal layer and interlayer dielectric by breaking some of the bonds on the outer surface of the metal stack structure. FIG. 6a illustrates a blow up of the cross-sectional view of a metal stack, in particular of the antireflective coating 630. Antireflective coating (arc layer) 630 is a trilayer structure made up of a titanium nitride layer 631, titanium layer 632, and titanium nitride layer 633. It should be noted and it will be obvious to one with ordinary skill in the art that although the antireflective coating illustrated in FIG. 6*a* is a trilayer structure other multiple layer or single layer structures may be used. As shown in FIG. 6*a*, during treatment with a plasma some of the bonds, for example titanium nitride (TiN) bonds, are broken, thus making the surface of the antireflective coating more reactive. The open bonds on the surface of arc layer 630, for example the open titanium (Ti) bonds, react when exposed to an oxygen flow 699 to form titanium oxide ($TiO_2$), as is illustrated in FIG. 6*b*. Titanium oxide has a greater adhesion to interlayer dielectric materials, for example oxides, than titanium nitride.

Because titanium oxide has better adhesive properties to an interlayer dielectric than titanium nitride the present invention improves the adhesion between the interlayer dielectric, such as an oxide, and the metal stack. Therefore, when contacts are formed in the interlayer dielectric which connect a metal layer to a metal stack, delamination of the interlayer dielectric and metal layers is less likely to occur thereby improving the electrical reliability of the semiconductor device.

It should also be noted that in one embodiment of the present invention the pretreatment step is performed in-situ. As discussed earlier, in some cases, the manufacturer may form metal stacks and then place the substrate (or wafer) in storage before depositing the interlayer dielectric. Such a storage step may expose the metal stack to many different ambients and or potential contaminants that may degrade ILD to metal adhesion. Thus, it may be advantageous to perform the pretreatment step in-situ, i.e. under vacuum without changing temperature, etc. so hat the metal stacks are not exposed to moisture or other potential contaminants that may degrade adhesion. It should be noted however, that although the pretreatment step may be an in-situ step in one embodiment it may be feasible to perform the pretreatment step as a separate processing step (i.e. not in-situ). This will be most effective when the ambient storage atmosphere is well controlled.

In order to determine the effectiveness of the pretreatment step the sheet resistance of the arc layer 630 may be measured before and after the treatment step. It should be noted and it will be obvious to one with ordinary skill in the art that the sheet resistance of the arc layer depends upon the thickness of the arc layer. The sheet resistance of the arc layer after the pretreatment step will depend in large part upon the process parameters of the pretreatment step, such as: time (or duration), particular plasma being used, etc. In one embodiment of the present invention an increase in the sheet resistance on the order of 3× was measured. Similar increases may be expected, however the order of magnitude of the increase depends in large part upon the particular process parameters and ARC layer being used, as stated above.

Figure 4F:
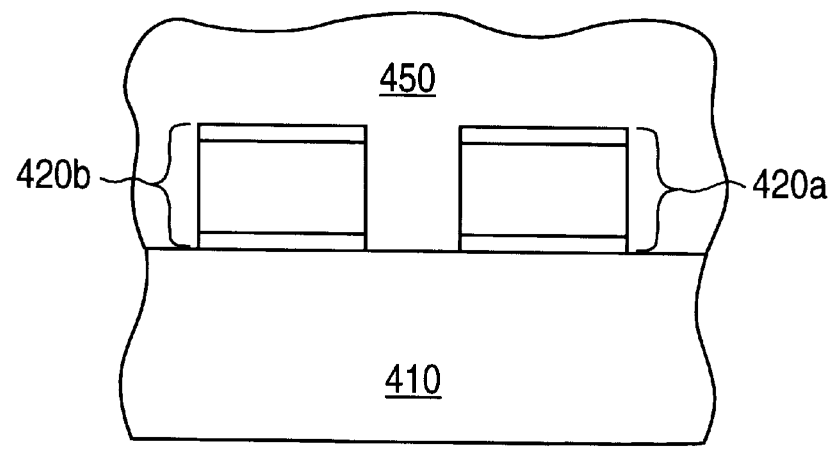
FIG. 4*f* illustrates a cross-sectional view of a portion of the semiconductor device of FIG. 4*e* having an interlayer dielectric deposited above the metal stacks.
Figure 4G:
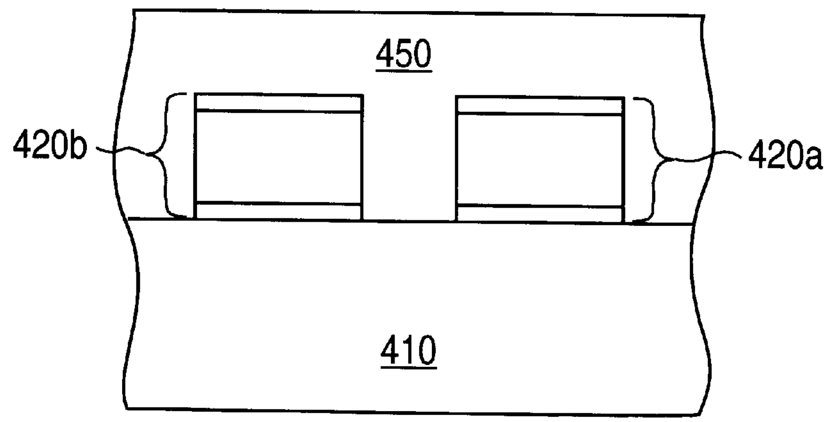
FIG. 4*g* illustrates a cross-sectional view of a portion of the semiconductor device of FIG. 4*f* after the planarization of the interlayer dielectric.

After the pretreatment step, then the interlayer dielectric is deposited. The first step of the interlayer dielectric deposition is to fill the chambers to the deposition pressure with oxygen gas ($O_2$), this facilitates the formation of the $TiO_2$ bonds as discussed with respect to FIG. 6*b* above. It should be noted that if an oxygen plasma is used it may not be necessary to use oxygen to fill the chamber since the oxygen plasma will break the TiN bonds and form $TiO_2$ at the same time, thus the user may decide whether or not to use oxygen in the first recipe steps. The next step of the interlayer dielectric deposition is to deposit a layer of an interlayer dielectric material onto the metal stacks 420*a* and 420*b* and the exposed portions of substrate 410, as is illustrated in FIG. 4*f*. In one embodiment of the present invention the interlayer dielectric is made up of an oxide, for example silicon dioxide. The final step of the interlayer dielectric deposition is to planarize the interlayer dielectric 450. Local and/or global planarization may be accomplished using processes such as SOG etchback or polishing. In one embodiment of the present invention the interlayer dielectric is planarized using chemical mechanical polishing. FIG. 4*g* illustrates the interlayer dielectric 450 after planarization.

Figure 4H:
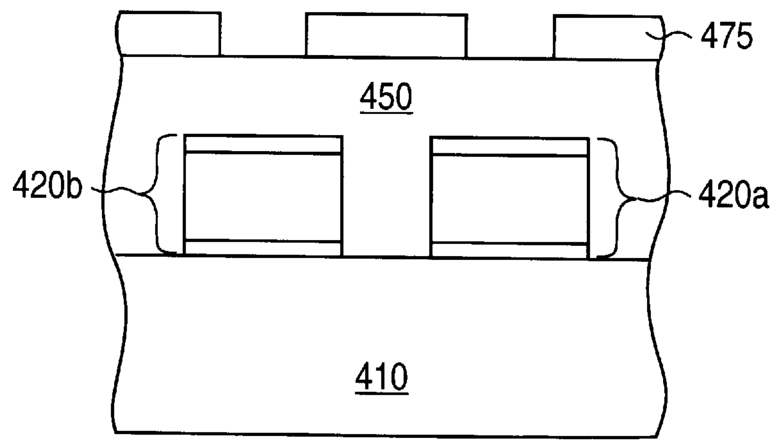
FIG. 4*h* illustrates a cross-sectional view of a portion of the semiconductor device of FIG. 4*g* having a patterned photoresist deposited thereon.
Figure 4I:
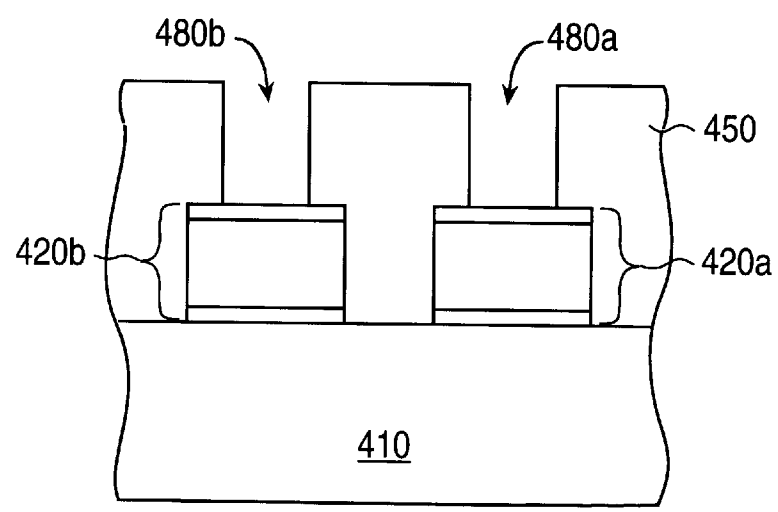
FIG. 4*i* illustrates a cross-sectional view of a portion of the semiconductor device of FIG. 4*h* having etched trenches in the interlayer dielectric.

FIG. 4*h* illustrates the deposition and patterning of another photoresist 475. As stated earlier, general photoresist deposition and patterning techniques are well known in the art and are therefore not discussed in detail herein. As illustrated in FIG. 4*i*, photoresist 475 is used as a pattern to form vias 480*a* and 480*b* in interlayer dielectric 450 which correspond to the location of the underlying metal stacks 420*a* and 420*b*. It should be noted and it will be obvious to one with ordinary skill in the art, that the etch chemistries used to form vias 480*a* and 480*b* will depend upon the type of materials used to form interlayer dielectric 450 and are generally well known in the art. Thus, the specific etch chemistries are not discussed herein.

Figure 4J:
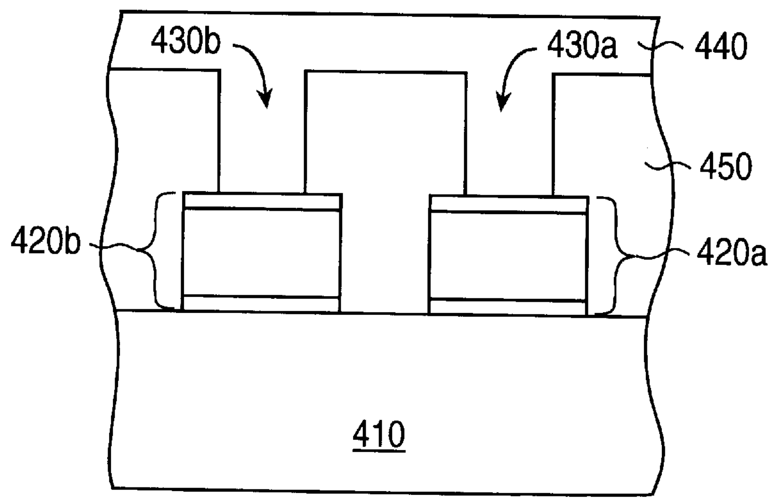
FIG. 4*j* illustrates a cross-sectional view of a portion of the semiconductor device of FIG. 4*i* after filling of the trenches and the formation of a metal layer above the interlayer dielectric.

FIG. 4*j* illustrates a cross-sectional view of the semiconductor device portion after vias 480*a* and 480*b* have been filled to form contacts 430*a* and 430*b* and after metal layer 440 has been formed. It should be noted and it will be obvious to one of ordinary skill in the art, that many processes and materials may be used to fill vias 480*a* and 480*b* and to form metal layer 440. For example an aluminum refill process may be used to simultaneously fill vias 480*a* and 480*b* and form metal layer 440. Another example may be to fill vias 480*a* and 480*b* using tungsten deposition techniques and then form metal layer 440 either separately or simultaneously.

It should be noted and it will be obvious to one with ordinary skill in the art that the present invention may be performed wherever it is desired to improve ILD to metal adhesion. It should also be noted, that although not shown in FIGS. 4*a*–4*j*, the present invention may be used along with the formation of anchored vias to further decrease the likelihood of delamination around the via location. Delamination can also occur along any metal to oxide interface which may cause reliability concerns, therefore the present invention may be used at any ILD to metal interface in order to decrease delamination.

Thus, An In-Situ Pre-ILD Deposition Treatment to Improve ILD to Metal Adhesion has been described. Although specific embodiments, including specific equipment, parameters, methods, and materials have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

What is claimed is:

1. A method to improve interlayer dielectric to metal adhesion comprising:

forming a metal layer;

patterning said metal layer;

treating said patterned metal layer with a dual frequency plasma; and depositing an interlayer dielectric above said patterned metal layer.

2. The method as described in claim 1 wherein said metal layer includes an antireflective coating on the top surface of said metal layer.

3. The method as described in claim 2 wherein said antireflective coating comprises titanium nitride.

4. The method as described in claim 2 wherein said antireflective coating is a trilayer stack comprising: titanium nitride, titanium, and titanium nitride.

5. The method as described in claim 1 wherein said treatment step is performed in-situ.

6. The method as described in claim 1 wherein said plasma is selected from the group consisting of: oxygen plasma, nitrogen plasma, helium plasma, and any combination thereof.

7. The method as described in claim 6 wherein said plasma is a dual frequency plasma.

8. The method as described in claim 1 further comprising the step of exposing said metal layer to oxygen after said step of treating said metal layer and before said step of depositing said interlayer dielectric if said plasma is not an oxygen plasma.

9. A method to improve interlayer dielectric to metal adhesion comprising:

forming a first metal layer;

patterning said first metal layer;

treating said first patterned metal layer with a dual frequency plasma;

depositing an interlayer dielectric;

forming a via in said interlayer dielectric above said first patterned metal layer;

filling said via to form a contact with said first patterned metal layer; and forming a second metal layer above said contact.

10. The method as described in claim 9 wherein said first metal layer includes an antireflective coating on the top surface of said first metal layer.

11. The method as described in claim 10 wherein said antireflective coating comprises titanium nitride.

12. The method as described in claim 10 wherein said antireflective coating is a trilayer stack comprising: titanium nitride, titanium, and titanium nitride.

13. The method as described in claim 9 wherein said treatment step is performed in-situ.

14. The method as described in claim 9 wherein said plasma is selected from the group consisting of: oxygen plasma, nitrogen plasma, helium plasma, and any combination thereof.

15. The method as described in claim 9 wherein said interlayer dielectric is selected from the group consisting of: silicon dioxide, PSG, and BPSG.

16. The method as described in claim 9 wherein said via is an anchored via.

17. The method as described in claim 9 wherein said via is filled using a tungsten fill technique.

18. The method as described in claim 9 wherein said via is filled using an aluminum reflow technique.

19. The method as described in claim 9 wherein said step of filling said via and said step of forming a second metal layer are performed at the same time.

20. The method as described in claim 9 further comprising the step of exposing said first metal layer to oxygen after said step of treating said first metal layer and before said step of depositing said interlayer dielectric if said plasma is not an oxygen plasma.

21. A method to improve interlayer dielectric to metal adhesion comprising:

forming a metal stack, wherein said metal stack comprises a barrier layer, a metal layer, and an antireflective coating;

patterning said metal stack;

treating said patterned metal stack with a dual frequency plasma selected from the group consisting of: oxygen plasma, nitrogen plasma, helium plasma, and any combination thereof;

depositing an interlayer dielectric above said patterned metal stack;

forming a via in said interlayer dielectric above said patterned metal stack;

filling said via to form a contact with said patterned metal stack; and forming a metal layer above said contact.

22. The method as described in claim 21 wherein said antireflective coating comprises titanium nitride.

23. The method as described in claim 21 wherein said antireflective coating is a trilayer stack comprising: titanium nitride, titanium, and titanium nitride.

24. The method as described in claim 21 wherein said treatment step is performed in-situ.

25. The method as described in claim 21 wherein said via is filled using a tungsten fill technique.

26. The method as described in claim 21 wherein said via is filled using an aluminum reflow technique.

* * * * *